(12) United States Patent
Jain et al.

(10) Patent No.: US 9,455,157 B1
(45) Date of Patent: Sep. 27, 2016

(54) METHOD AND APPARATUS FOR MITIGATING PARASITIC COUPLING IN A PACKAGED INTEGRATED CIRCUIT

(71) Applicant: Anokiwave, Inc., San Diego, CA (US)

(72) Inventors: Vipul Jain, Irvine, CA (US); Noyan Kinayman, Harvard, MA (US); Amir Esmaili, San Diego, CA (US); Guarav Menon, San Marcos, CA (US); Nitin Jain, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 14/846,092

(22) Filed: Sep. 4, 2015

(51) Int. Cl.
| | |
|---|---|
| *H01L 21/48* | (2006.01) |
| *H01L 23/552* | (2006.01) |
| *H01L 23/495* | (2006.01) |
| *H01L 23/66* | (2006.01) |
| *H01L 23/31* | (2006.01) |
| *H01L 21/56* | (2006.01) |
| *H01L 23/498* | (2006.01) |
| *H01L 23/00* | (2006.01) |

(52) U.S. Cl.
CPC ......... *H01L 21/481* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49562* (2013.01); *H01L 23/49838* (2013.01); *H01L 23/552* (2013.01); *H01L 23/66* (2013.01); *H01L 24/06* (2013.01); *H01L 24/42* (2013.01); *H01L 24/46* (2013.01)

(58) Field of Classification Search
CPC ............. H01L 23/49838; H01L 24/42; H01L 23/49503; H01L 23/495; H01L 21/481; H01L 24/46; H01L 24/06
See application file for complete search history.

(56) References Cited

U.S. PATENT DOCUMENTS

| | | | | |
|---|---|---|---|---|
| 7,087,993 | B2* | 8/2006 | Lee | ...... H01L 23/3107 257/728 |
| 7,129,568 | B2* | 10/2006 | Lee | ...... H01L 23/3107 257/666 |
| 8,558,398 | B1* | 10/2013 | Seetharam | ........ H01L 23/49503 257/784 |
| 8,866,283 | B2* | 10/2014 | Chen | ................... H01L 23/4952 257/690 |
| 2005/0017352 | A1* | 1/2005 | Lee | ......................... H01L 23/66 257/728 |
| 2005/0082645 | A1* | 4/2005 | Lee | ..................... H01L 23/3107 257/666 |
| 2005/0098860 | A1* | 5/2005 | Lai | ..................... H01L 23/3107 257/666 |
| 2006/0006505 | A1* | 1/2006 | Chiang | ............... H01L 21/4825 257/666 |
| 2011/0198742 | A1* | 8/2011 | Danno | .................. H01L 21/561 257/676 |
| 2012/0313219 | A1* | 12/2012 | Chen | ................... H01L 23/4952 257/532 |

* cited by examiner

*Primary Examiner* — Alonzo Chambliss
(74) *Attorney, Agent, or Firm* — Sunstein Kann Murphy & Timbers LLP

(57) ABSTRACT

A packaged IC has a package with a die paddle, a signal lead, and a ground lead. The packaged IC also has a die, secured to the package, with a ground pad and a signal pad. The signal pad is electrically connected to the signal lead, and the ground pad is electrically connected to both the die paddle and the ground lead.

21 Claims, 8 Drawing Sheets

METHOD AND APPARATUS FOR MITIGATING PARASITIC COUPLING IN A PACKAGED INTEGRATED CIRCUIT

FIELD OF THE INVENTION

The invention generally relates to integrated circuits/dice and, more particularly, the invention relates to packaging integrated circuits/dice and mitigating noise issues when packaging integrated circuits/dice.

BACKGROUND OF THE INVENTION

Integrated circuit dice typically are mounted within an integrated circuit package. Among other functions, integrated circuit packages can both protect the dice from the environment and facilitate mounting to an underlying system, such as a printed circuit board or other integrated circuit.

Those in the art have developed many different types of packages for a wide variety of applications. One of the more commonly used types of packages is known as a "leadframe" package. Specifically, a leadframe package often has a metallic leadframe (e.g., formed from copper) for electrically connecting the die/integrated circuit to the external environment, and an encapsulant, such as injection molding material or plastic, encapsulating much of the leadframe and the die. Quite often, the encapsulant and leadframe form a rectangularly shaped body for readily securing to an underlying system.

The leadframe often has two primary parts; namely, a die paddle for supporting the integrated circuit die, and a plurality of leads for electrically connecting the die with the underlying system. To those ends, a die attach material often physically secures the die to the die paddle, while a wirebond or other interconnect electrically connects the die to the leads. In fact, the interior of a packaged integrated circuit often has dozens or hundreds of wirebonds that connect the die to the leads.

Undesirably, during use, given their close proximity within the small volume of the package, wirebonds can electrically couple to degrade the signal produced by the die. This issue can become particularly acute when operating the die at high frequencies. In fact, this coupling can limit the range of frequencies at which a high-frequency die can operate.

SUMMARY OF VARIOUS EMBODIMENTS

In accordance with one embodiment of the invention, a packaged integrated circuit ("packaged IC") has a package with a die paddle, a signal lead, and a ground lead. The packaged IC also has a die, secured to the package, with a ground pad and a signal pad. The signal pad is electrically connected to the signal lead, and the ground pad is electrically connected to both the die paddle and the ground lead.

Among other things, the die may include a via extending from the ground pad and electrically connect with the die paddle. To conserve overall real-estate, the die may have a plurality of edges that form a die footprint, and the die paddle may be within the die footprint—either in total or in part. Also, like other dice, the die has a top side and an opposing back side. The top side has the ground pad and the signal pad, while the back side has back side die metal in contact with the ground pad through the via. To make the desired electrical connection, the back side die metal is electrically connected with the die paddle (e.g., using conductive adhesive). In addition to having the connection using the via, the packaged IC also may have a wirebond connecting the same ground pad to the ground lead.

Other embodiments do not necessarily use a via. Instead, such embodiments may use a first wirebond connected between the ground pad and the ground lead. As such, the first wirebond may be considered to physically connect the ground pad with the ground lead. The packaged IC further has a second wirebond connected between the same ground pad and the die paddle, thus electrically connecting the ground pad with the die paddle.

The package preferably is a leadframe package, with its die paddle and ground pad configured to be at a ground potential when energized (e.g., when mounted to a printed circuit board and in use in a larger circuit). Among other applications, the die may implement a phased array operating at frequencies of between about 1 Megahertz and 100 Gigahertz. Other embodiments may extend to lower frequencies (e.g., 100 Hertz) or higher frequencies (e.g., up to about 110 Gigahertz)

The die preferably has a second ground pad, and the package preferably has a corresponding second ground lead. The second ground pad may be electrically connected to both the die paddle and the second ground lead. In that case, the signal lead preferably is positioned between the ground lead and the second ground lead.

In accordance with another embodiment, a packaged IC has a phased array die (e.g., a die having at least part of a phased array system) with a plurality of die RF groups. Each die RF group includes a first ground pad, a signal pad, and a second ground pad. In addition, the die also has a package with a die paddle and a plurality of package RF groups. In a manner similar to the die RF groups, each package RF group includes a first ground lead, a signal lead, and a second ground lead. A plurality of connectors connects a given die RF group with a given package RF group. The given die RF group has given first and second ground pads and a given signal pad. In a similar manner, the given package RF group has given first and second ground leads and a given signal lead.

To make the appropriate connections, the plurality of connectors includes a first connector, a second connector, and a third connector. The first connector connects the given first ground pad to the given first ground lead, the second connector connects the given second ground pad to the given second ground lead, and the third connector connects the given signal pad to the given signal lead. The plurality of connectors also has a first paddle connector connecting the given first ground pad to the die paddle, and a second paddle connector connecting the given second ground pad to the die paddle.

In accordance with other embodiments of the invention, a method of forming a packaged IC provides a die having a ground pad and a signal pad, and also provides a leadframe base having a die paddle, a ground lead, and a signal lead. The method then electrically connects the signal pad of the die with the signal lead of the leadframe base, and electrically connects the ground pad of the die with the ground lead of the leadframe base. In addition, the method electrically connects the same ground pad of the die with the die paddle of the leadframe base, and encapsulates the die and at least part of the leadframe base. Additional materials, such as an epoxy may, in conjunction with the leadframe base, further encapsulate the die.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged integrated circuit ("packaged IC") has an optimized connection arrangement to mitigate parasitic interference between its internal electrical connections. To that end, the packaged IC has a package with both a ground lead and a die paddle. An internal die encapsulated by the package has a corresponding ground pad that, using two separate conductive paths, connects both to the ground lead and the die paddle of the package.

Among other ways, those two conductive paths may be formed through a pair of separate wirebonds, or by using a conductive via formed through the die (e.g., a "through-silicon-via) and a separate wirebond. As such, the aggregate length of the electrical connections is reduced, thus reducing the parasitic coupling between both those two connections, and between those two connections and other conductors in the packaged IC (e.g., wirebonds connecting other die pads to other package leads). Less parasitic coupling improves die performance over a variety of prior art devices known to the inventors. Details of illustrative embodiments are discussed below.

Figure 1:
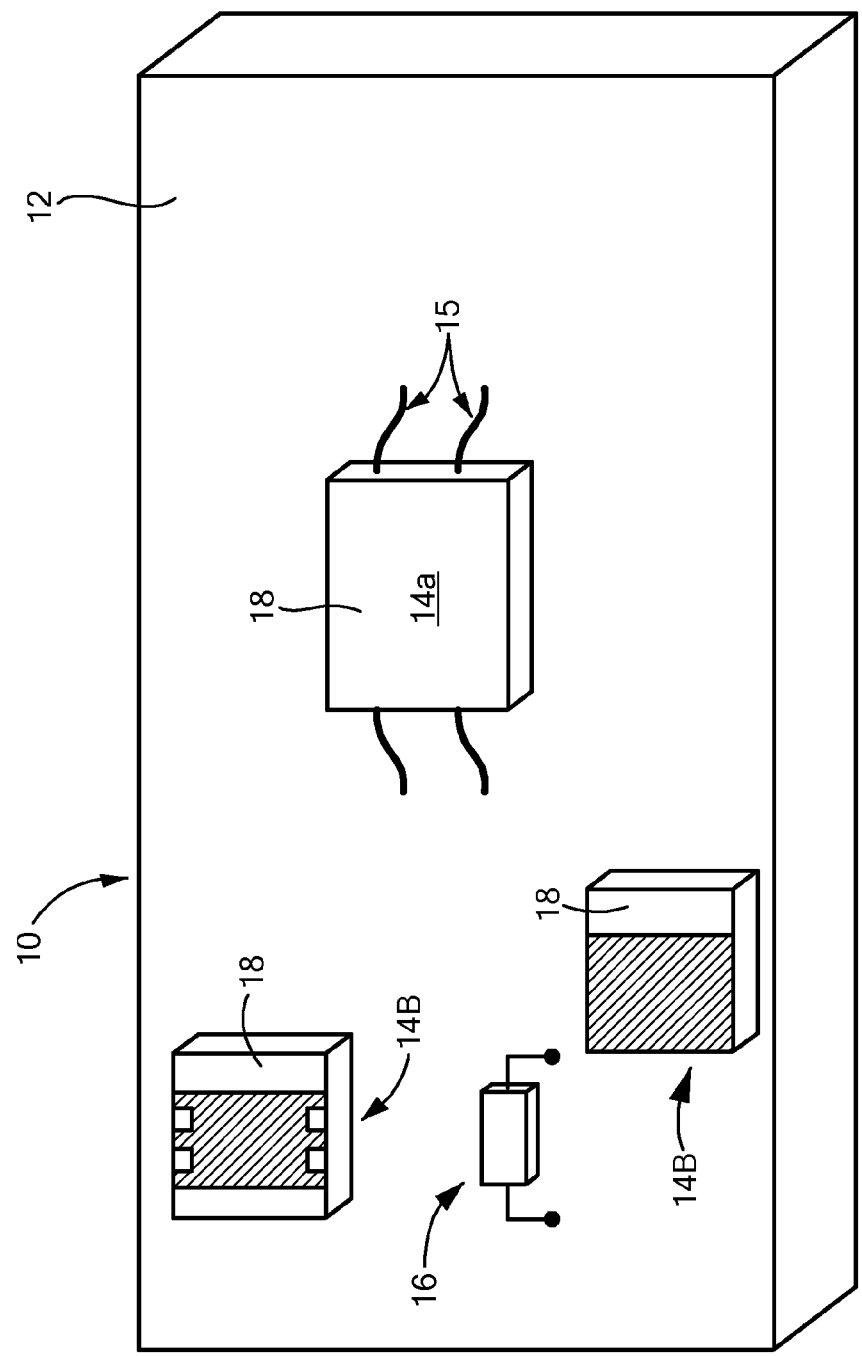
FIG. 1 schematically shows a system that may implement illustrative embodiments of the invention.

FIG. 1 schematically shows a system 10 using leadframe packages configured in accordance with illustrative embodiments of the invention. Specifically, the system 10 includes a plurality of circuit components mounted on a conventional printed circuit board 12. Among other things, those components include three packaged ICs 14. Specifically, the packaged ICs 14 include a first type of packaged IC, having a "leaded" leadframe package 18 (identified by reference number "14A") that encapsulates one or more dice 20 (shown in FIG. 2A and later figures). Accordingly, this packaged IC 14A has a plurality of leads 15, extending from its bottom side, that are soldered to the circuit board 12. Each of those leads 15 electrically connects the internal die 20 with other electronic components and devices.

In addition, the system 10 also has two other packaged ICs 14 that each include leadless packages 18 (identified by reference number "14B") encapsulating one or more dice 20. More particularly, the leadless packages 14B each have internal leads that terminate at bottom-side bond pads (not shown) surface mounted to the circuit board 12. Accordingly, because they have no leads 15 extending from their bodice (the leads 15 are internal), the leadless packages 14B favorably do not require the extra lateral space required by the leaded package 18, such as the package 18 of packaged IC 14A.

Those skilled in the art may include other circuit components 16 (shown schematically in FIG. 1) on the circuit board 12. For example, those components 16 may include additional integrated circuits (e.g., converters, MEMS, power chips, etc.) and/or discrete components (e.g., diodes, transistors, capacitors, and resistors). Those skilled in the art may select the appropriate components for the requisite application.

In illustrative embodiments, one or more of the packaged ICs 14 implements a phased array within a so-called "quad-flat no-leads" ("QFN") package. Accordingly, the package 18 may be considered a near chip scale package having an exposed leadframe/die paddle (discussed in detail below) to assist with thermal management, grounding, and signal transmission. Indeed, it should be reiterated that a QFN package is discussed for illustrative purposes only and not intended to limit various embodiments. Those skilled in the art understand that other types of leadframe packages 18 and, in some cases, non-leadframe packages 18, could effectively implement various embodiments of the invention.

Illustrative embodiments apply to a die 20 implementing any of a variety of functions. For example, as noted above, various embodiments apply to a packaged IC 14 implementing a phased array. In that case, the die 20 may generate a plurality of phase shifted signals. Specifically, as known by those in the art, a phased array device may operate with an antenna to produce electrically steerable signals that are phased shifted relative to one another. As such, the signals constructively and/or destructively interfere with each other to steer the beams in a desired direction, amplify in a pre-specified manner, and/or improve beam sharpness.

The phased array packaged IC 14 preferably operates across a wide variety of frequencies. For example, those frequencies can range from the 25 Hertz range to tens of Gigahertz (e.g., 100 Gigahertz). Prior art packaging schemes known to the inventors used with phased array dice, however, are substantially limited. For example, such prior art packaging uses many relatively long wirebonds to electrically connect the die 20 with the package 18. During use, however, those long wirebonds produce a parasitic inductance that undesirably limits the available frequencies the die 20 can use. For example, such parasitic inductances often limit the frequencies to 20 Gigahertz or less. In addition, prior art packaging techniques for phased array dice known to the inventors often do not provide adequate isolation between different RF signal lines in a package. As explained below, however, illustrative embodiments optimize the die packaging to effectively extend the range of frequencies available to the phased array die 20—preferably beyond 20 Gigahertz. In fact, during simulations, the inventors were surprised to see improvements that virtually doubled the effective frequency range of such a packaged IC 14.

It should be noted that, as with the package example above, various embodiments may apply to other types of dice 20. For example, illustrative embodiments may apply to dice 20 implementing RF amplifiers that control the amplitude of signals transmitted to and from an antenna. Discussion of a die 20 implementing a phased array, and such a die 20 operating at specific frequencies, therefore is for exemplary purposes only.

Figure 2A:
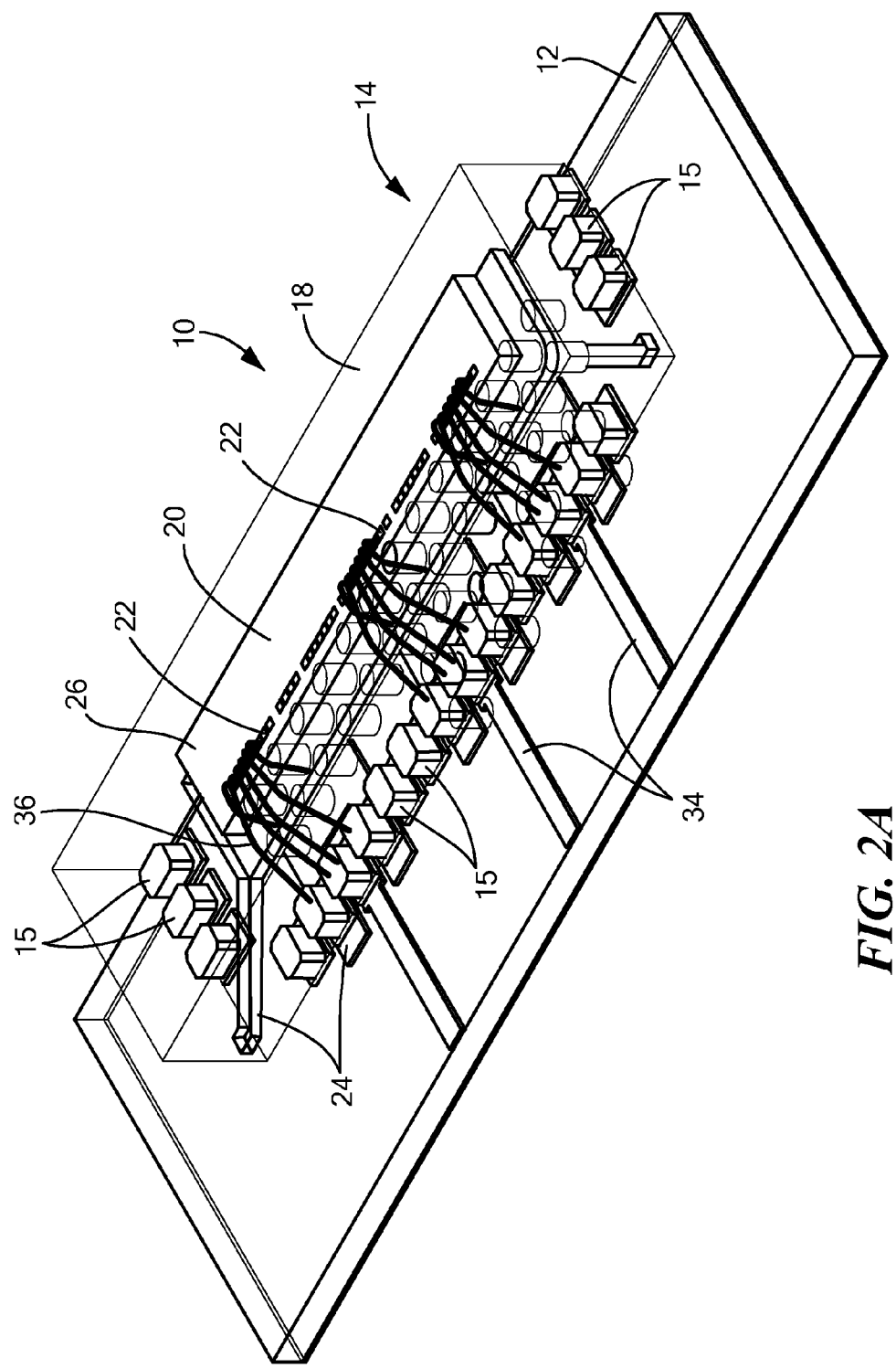
FIG. 2A schematically shows a perspective view of a smaller portion of a printed circuit board having a packaged IC configured in accordance with one embodiment of the invention using a wirebond to connect with a die paddle. This figure only shows one side of the packaged IC for clarity; other embodiments may have connections on all sides.

FIG. 2A schematically shows a perspective view of a smaller portion of the system 10 of FIG. 1. In illustrative embodiments, the die may be formed from a number of different technologies. For example, the die may be fabricated using any of CMOS, SOI (silicon-on-insulator) CMOS, or silicon-germanium BiCMOS technologies.

As shown, the die 20 has a plurality of pads (shown schematically and generally identified by reference number 22) that enable it to communicate with other devices through leads 15 of the package 18. In particular, as noted above, the package 18 preferably is a leadframe package 18 having a copper leadframe 24 and encapsulant material ("encapsulant 26"). To better show the components, however, this view shows the encapsulant 26 as being substantially transparent. Those skilled in the art should understand that the encapsulant 26 often is opaque, such as a solid black. The leadframe 24, whether it is part of a post-molded or a premolded leadframe package 18, may be considered to form a base upon which the die 20 is mounted.

The leadframe 24 has a relatively flat aggregate shape with a plurality of leads 15 along its periphery. For example, the leadframe 24 shown in FIG. 2A has a plurality of leads 15 along three of its peripheral edges. In this embodiment, the leads 15 are generally flush with a bottom side of the package 18 and thus, do not extend from the package 18. This type of package is similar to the leadless packages 14B of FIG. 1. As such, this package 18 may be surface mounted to the printed circuit board 12. Other embodiments, however, may have leads 15 extending from the package 18 and thus, may be connected to the printed circuit board 12 using other techniques, such as conventional through-hole mounting technology. Indeed, those skilled in the art can select the appropriate position and number of leads 15, their use, and type for their specific application. Accordingly, discussion of specific positioning and numbers of leads 15 is for illustrative purposes.

The leadframe 24 also has a large centrally located portion known in the art as a "die paddle 30." In illustrative embodiments, the die paddle 30 preferably has a ground potential during use. As discussed in greater detail below, the die 20 has specified pads 22 that electrically connect with both the die paddle 30 and at least one of the leads 15 along the periphery of the leadframe 24. To the surprise of the inventors, simulations have shown that this dual connection substantially mitigates parasitic RF coupling, effectively improving device performance and extending the effective frequency range of the packaged IC 14.

The leads 15 of the package 18 preferably form a plurality of "RF groups 32" for managing signal transmission to and from the die 20 and the printed circuit board 12. In a similar manner, both the printed circuit board 12 and the die 20 also may be considered to respectively form corresponding RF groups 32 of pads 22 and conductive transmission lines 34. Illustrative embodiments mitigate or reduce the RF parasitic coupling between the different RF groups 32.

Figure 2B:
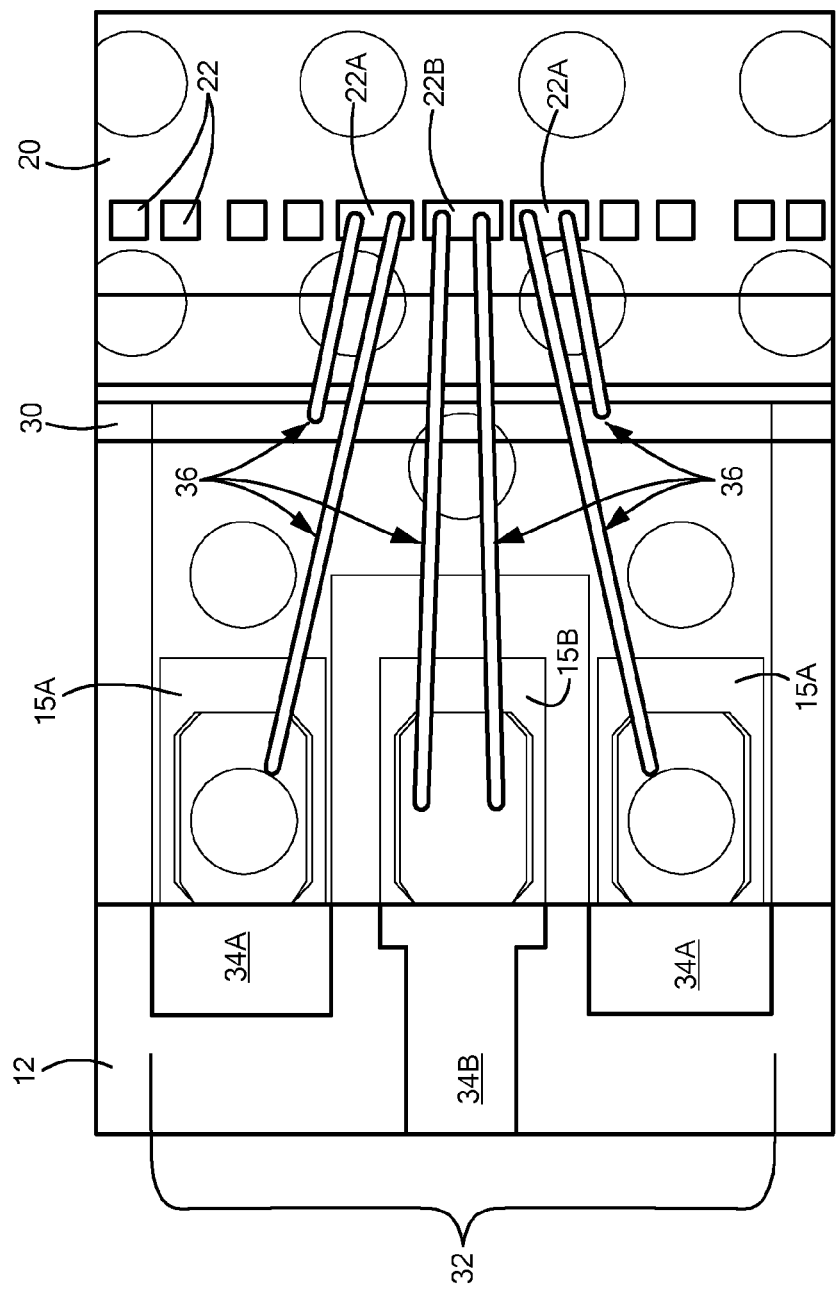
FIG. 2B schematically shows a plan view of an RF group of leads and pads of the packaged IC and printed circuit board of FIG. 2A.

Specifically, FIG. 2B schematically shows an enlarged plan view of an RF group 32 of leads 15 of the package 18 (i.e., of the leadframe 24), pads 22 of the packaged IC 14, and lines 34 of the printed circuit board 12. As shown, the RF group 32 of FIG. 2B has a central signal lead 15B for electrically connecting a signal pad 22B on the die 20 with a corresponding signal line 34B of the printed circuit board 12. In the embodiment shown, for a given RF group 32, a pair of wirebonds 36 electrically connects the signal pad 22B with the single signal lead 15B on the leadframe 24. The signal lead 15B correspondingly is surface mounted directly to the signal line 34B in the printed circuit board 12.

Use of two wirebonds 36 in this manner is believed to improve performance. Some embodiments, however, may use more than two wirebonds 36 to make this connection. Other embodiments may use only one wirebond 36. Those skilled in the art can select an appropriate wirebond number and configuration based on the performance desired.

In addition to having the signal lead 15B, each of the die/leadframe/circuit board RF groups 32 also preferably has a pair of ground interfaces on each side of their respective signal interfaces. Accordingly, the lead RF group 32 includes a pair of ground leads 15A that preferably are grounded during use. From its orientation in FIG. 2B, the RF group 32 of the leadframe 24 has ground leads 15A physically positioned on each side of the signal lead 15B. In a similar manner, the die 20 and printed circuit board 12 also have respective ground pads 22A and ground lines 34A on each side of their respective signal pads 22B and signal lines 34B to complete their respective RF groups 32. Wirebonds 36 electrically and physically connect each ground pad 22A of the die 20 with each ground lead 15A of the package 18. For example, FIG. 2B shows a single wirebond 36 extending from each ground pad 22A (of the discussed RF group 32) to one corresponding ground lead 15A of the package 18. In a corresponding manner, each ground lead 15A of the package 18 is electrically connected to one of the ground lines 34A of the printed circuit board 12.

Figure 2C:
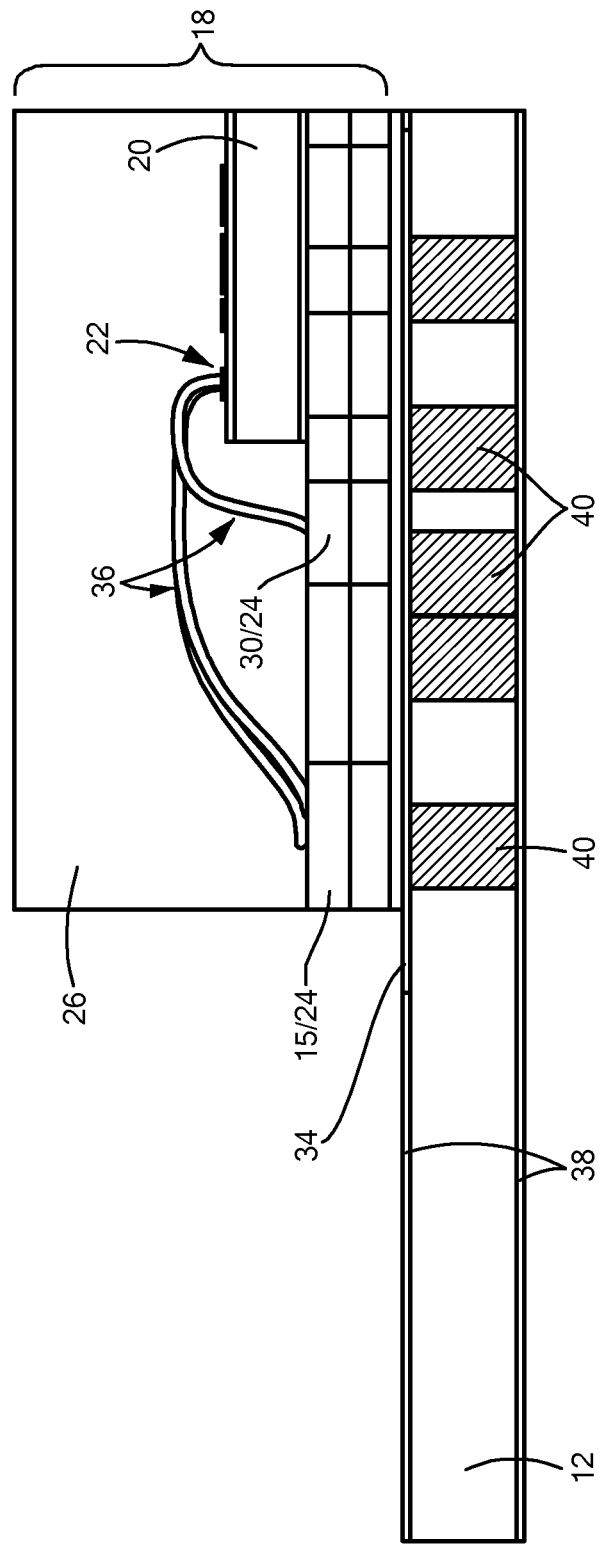
FIG. 2C schematically shows a cross-sectional view of the packaged IC and printed circuit board of FIG. 2A.

As noted above, each ground pad 22A also is directly connected to the die paddle 30 through a shorter wirebond 36. FIG. 2C, which schematically shows a cross-sectional view of the packaged IC 14 and printed circuit board 12 of FIG. 2A, also shows this connection. As such, each ground pad 22A of the RF group 32 electrically connects with both the die paddle 30 and a corresponding ground lead 15A. As noted, both the die paddle 30 and ground lead 15A are grounded during use.

Due to the physical makeup of the leadframe 24 and the die 20, for a given ground pad 22A, the wirebond 36 connecting to the ground lead 15A is longer than the wirebond 36 connecting to the die paddle 30. This arrangement consequently should favorably mitigate parasitic RF coupling between different RF groups 32 (compared to having two long wirebonds 36 between the ground pad 22A and the ground lead 15A), while providing the necessary grounding for the device.

FIG. 2C also shows metal layers 38 and printed circuit board vias 40 that at least in part forms the signal lines 34B and the ground lines 34A. For example, in the embodiments shown in FIGS. 2A-2C, the signal line 34B of the top surface of the printed circuit board 12 connects with at least one printed circuit board via 40, which electrically connects to other metal 38 within or on the printed circuit board 12.

The inventors simulated three similar devices: 1) a prior art device that does not connect with the die paddle 30, 2) a prior art device that connects only to the paddle 30, and 3) the embodiment of FIGS. 2A-2C. In all cases, the die 20 implemented a phased array across a range of frequencies between 10 and 25 Gigahertz. The prior art devices had substantial parasitic coupling at about 20 Gigahertz, which undesirably limits the number of applications in which it may be used. In contrast, the embodiment of FIGS. 2A-2C showed negligible to no substantial parasitic coupling across the entire frequency range. Accordingly, illustrative embodiments should be capable of operating across a wider range of frequencies. For example, such embodiments are anticipated to operate between frequencies of 1 Megahertz and 50 Gigahertz or greater (e.g., up to 100 Gigahertz).

Figure 3A:
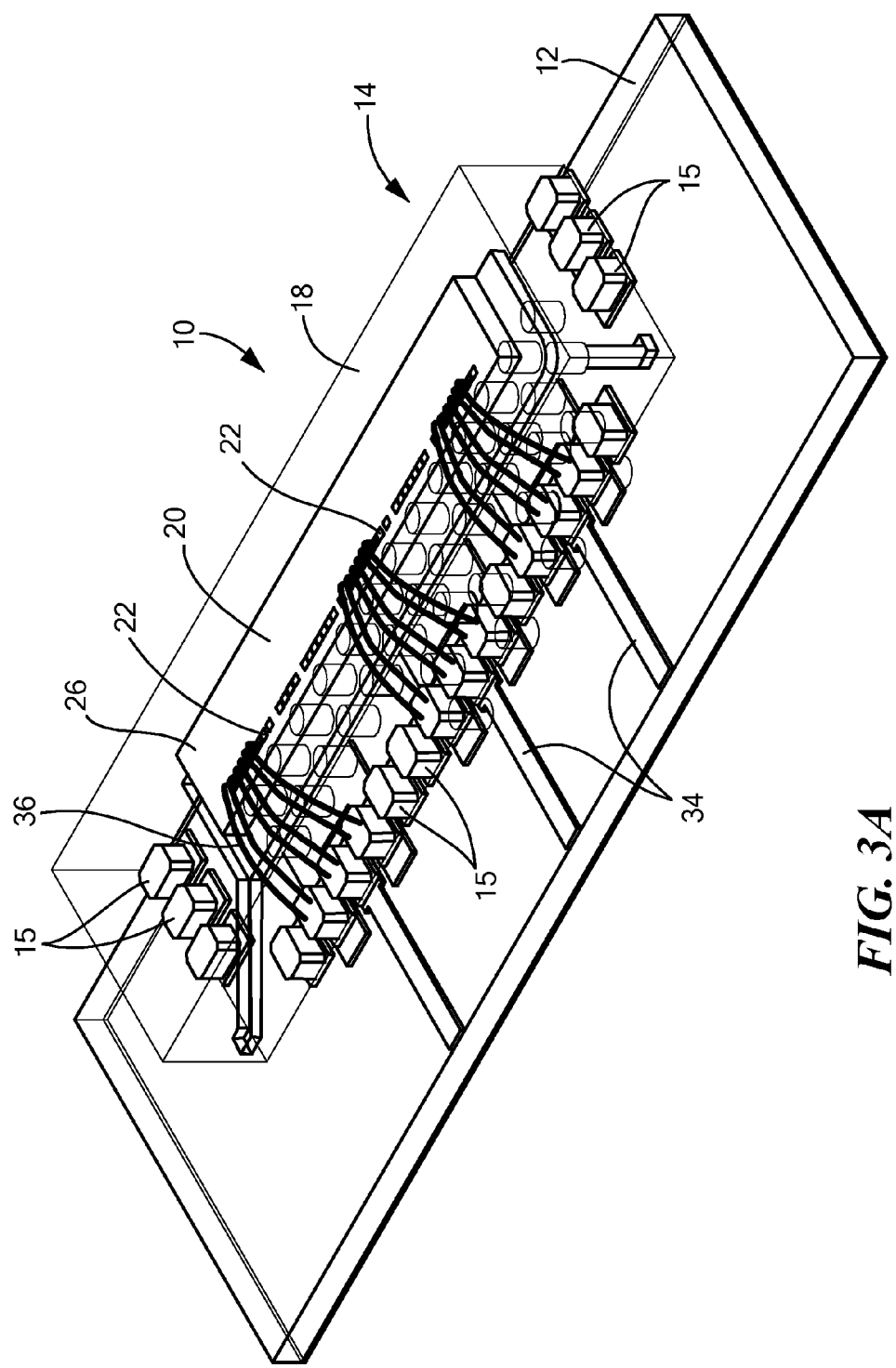
FIG. 3A schematically shows a perspective view of a smaller portion of a printed circuit board having a packaged IC configured in accordance with another embodiment of the invention using a via to connect with a die paddle. This figure only shows one side of the packaged IC for clarity; other embodiments may have connections on all sides.
Figure 3B:
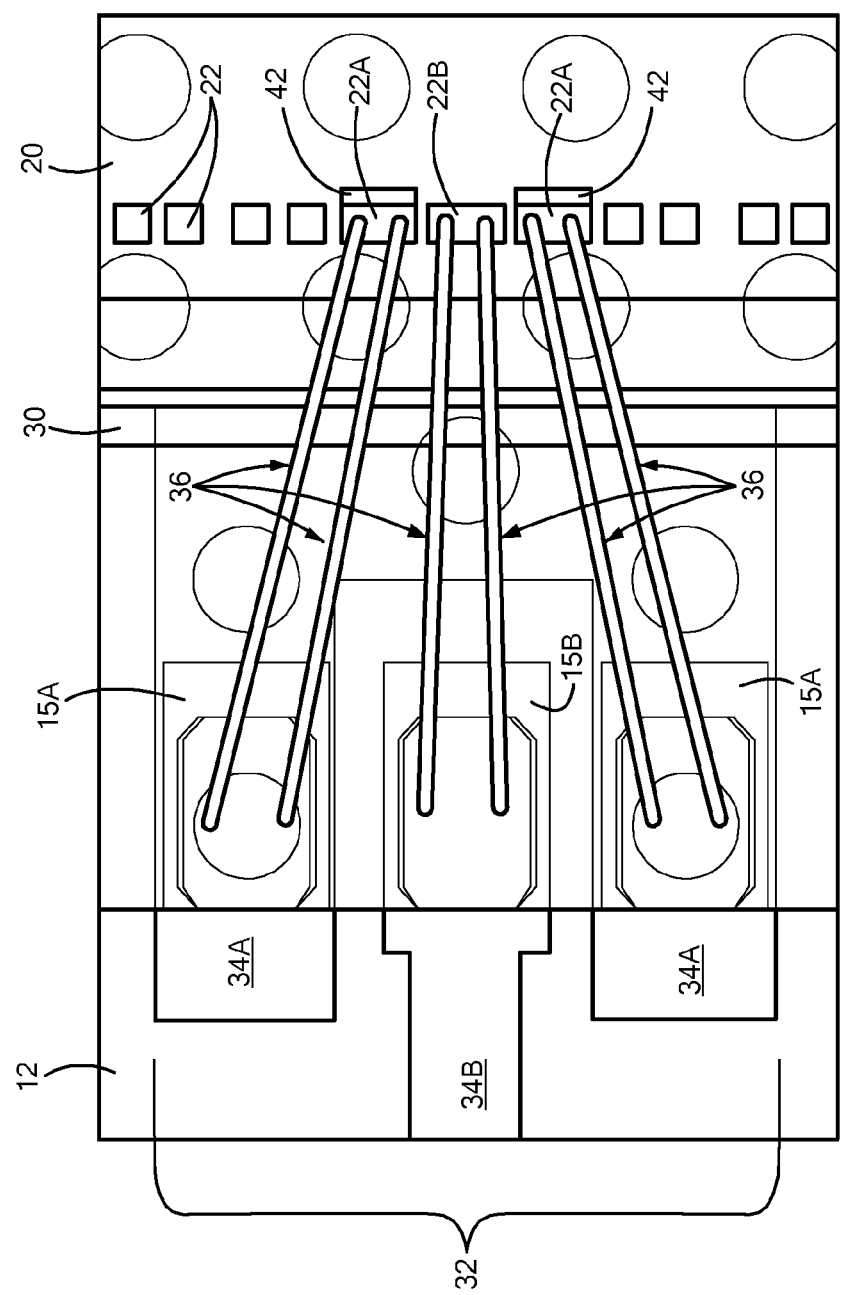
FIG. 3B schematically shows a plan view of an RF group of leads and pads of the packaged IC and printed circuit board of FIG. 3A.
Figure 3C:
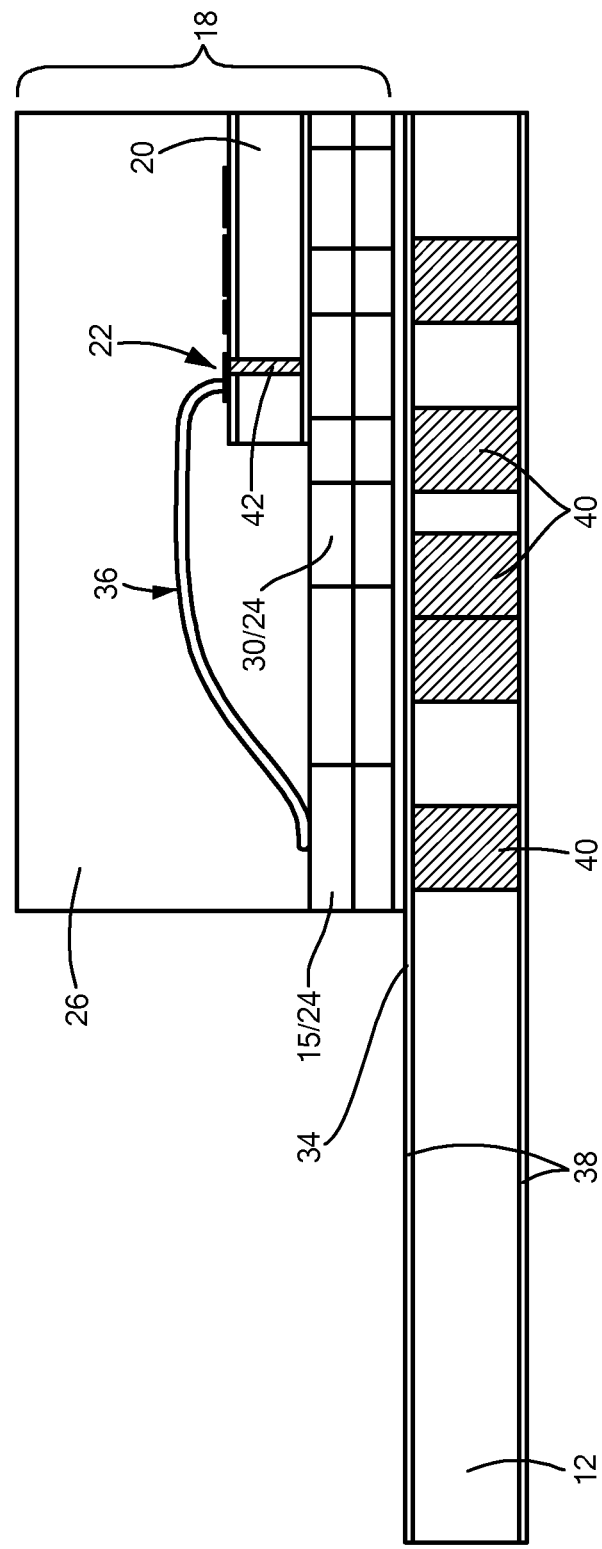
FIG. 3C schematically shows a cross-sectional view of the packaged IC and printed circuit board of FIG. 3A.

Rather than using the wirebond 36, other embodiments physically and electrically connect the ground pad 22A of the RF group 32 to the die paddle 30 through a conductive die via 42 (i.e., through the die 20 itself). FIGS. 3A-3C schematically show one such embodiment. To demonstrate some of their similarities and differences, FIGS. 3A-3C show the same three views as those of FIGS. 2A-2C; namely, a perspective view, an enlarged plan view of a single RF group 32, and a cross-sectional view.

Specifically, in a manner similar to the embodiment of FIGS. 2A-2C, this embodiment also has the same RF groups 32, and the die 20 mounted upon the die paddle 30. In addition, this embodiment also has a pair of wirebonds 36 connected between each signal pad 22B and its corresponding signal lead 15B. The configuration differs from the earlier embodiment, however, with respect to the connections between each die ground pad 22A its two connections with the die paddle 30 and ground lead 15A.

To that end, this embodiment connects a pair of wirebonds 36 between each ground pad 22A and its corresponding ground lead 15A. Alternatively, this embodiment may connect only a single wirebond 36, or more than two wirebonds 36, between each ground pad 22A and its corresponding ground lead 15A. Moreover, to further mitigate potential parasitic RF coupling, this embodiment connects each ground pad 22A with the die paddle 30 by means of one or more die vias 42 extending through the die 20. For example, the die 20 may have a plurality of die vias 42 electrically connecting each ground pad 22A of an RF group 32 to metallization on the bottom of the die 20. In some embodiments, the die via 42 itself forms the metallization on the bottom of the die 20. As noted below with regard to FIG. 4, this metallization layer on the bottom of the die 20 connects directly to the die paddle 30, making the requisite electrical connection.

By using die vias 42, the die 20 and printed circuit board 12 may be smaller than the embodiment described above with regard to FIGS. 2A-2C. Specifically, the embodiment of FIGS. 2A-2C requires that the die 20 not completely cover the die paddle 30—the die paddle 30 must be exposed so that it can physically connect with the wirebond 36. Without requiring the noted wirebond connection, however, the footprint of the die 20 of the embodiment of FIGS. 3A-3C can be very close to the size of the die paddle 30. In other words, the footprint of the die 20, which is defined by its bottom outer periphery from the perspective of the drawings, can be very close to the size of the die paddle 30 because no wirebond access to the die paddle 30 is necessary. Accordingly, this latter embodiment favorably mitigates parasitic RF coupling while reducing the size requirements of the package 18 and printed circuit board 12.

The inventors also simulated the embodiment of FIGS. 3A-3C and compared it to the above noted prior art device simulated in a comparison against the embodiment of FIGS. 2A-2C. The dice 20 were implemented a phased array across a range of frequencies between 25 to 40 Gigahertz (i.e., higher frequencies than those for the prior noted simulation). The prior art device showed substantial parasitic coupling at about 37 Gigahertz, which, again, limits the number of applications in which it may be used. In contrast, the embodiment of FIGS. 3A-3C showed negligible to no substantial parasitic coupling across the entire frequency range. Accordingly, like the embodiment of FIGS. 2A-2C, illustrative embodiments should be capable of operating across a wider range of frequencies—up to or exceeding 50 Gigahertz.

Figure 4:
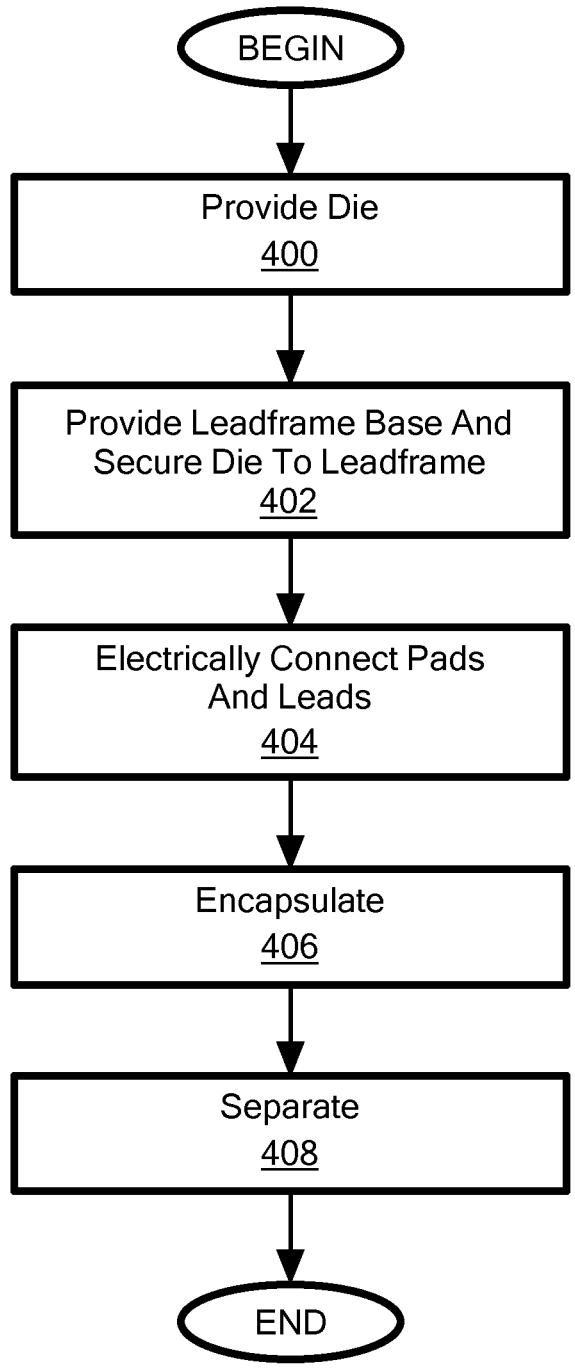
FIG. 4 shows a process of forming the packaged IC of FIGS. 1, 2A, and 3A in accordance of illustrative embodiments of the invention.

FIG. 4 shows a process of forming the packaged ICs 14 of FIGS. 1, 2A, and 3A in accordance of illustrative embodiments of the invention. It should be noted that this process is substantially simplified from a longer process that normally would be used to form the packaged ICs 14. Accordingly, the process of forming the packaged ICs 14 has many steps, such as testing steps, etching steps, or additional passivation steps, which those skilled in the art likely would use. In addition, some of the steps may be performed in a different order than that shown, or at the same time. Those skilled in the art therefore can modify the process as appropriate. Moreover, as noted above and below, many of the materials and structures noted are but one of a wide variety of different materials and structures that may be used. Those skilled in the art can select the appropriate materials and structures depending upon the application and other constraints. Accordingly, discussion of specific materials and structures is not intended to limit all embodiments.

The process of FIG. 4 preferably uses bulk packaging techniques, which form a plurality of packaged ICs 14 on a large sheet of individually formed leadframes 24 at the same time. Although much less efficient, those skilled in the art can apply these principles to a process that forms only one packaged IC 14.

The process of FIG. 4 begins at steps 400, which provides the die 20. As noted above, the die 20 may have pads 22 with die vias 42 extending from top to bottom, or it may have pads 22 but no die vias 42. Selection of the appropriate die 20 depends upon the embodiment being implemented.

The process also provides a leadframe base at step 402. As a batch process, the leadframe base is formed from a sheet of copper etched or otherwise processed to form a two-dimensional array of individual leadframes 24 having die paddles 30 and leads 15. Each individual leadframe 24 receives/connects with a single die 20.

Step 402 continues by securing the dice 20 to the leadframe base. To that end, the process applies an adhesive to the bottom of each die 20, and places the dice 20 on the respective die paddles 30 of the leadframe base. The embodiment of FIGS. 3A-3C, which has die vias 42, preferably secures the dice 20 using a conductive adhesive that provides an appropriate electrical contact between the die paddle 30 and the die via 42/metallization terminating at the bottom of the die 20. Other embodiments, however, such as those of FIGS. 2A-2C, may use a nonconductive adhesive, or some other securing means. Those skilled in the art can select the appropriate means for connecting the dice 20 to their respective die paddles 30.

After the dice 20 are secured to the leadframe base, the process continues to step 404, which electrically connects the pads 22 and the leads 15 as shown in FIGS. 2A-2C, 3A-3C, or in other alternative embodiments. To that end, the process may solder the wire bonds to the appropriate leads 15 and pads 22.

Next, step 406 encapsulates the leadframe base, dice 20, and their connections in the noted encapsulant 26, such as an opaque plastic. Embodiments in which the leadframe base is a premolded leadframe package 18, however, may not require such encapsulant 26. Instead, such embodiments may secure an array of lids to the array of leadframes 24.

The process concludes at step 408, which separates the various leadframes 24 and their cured encapsulant 26 into individual packaged ICs 14. Accordingly, conventional dicing operations cut through the encapsulant 26 and leadframe 24 of the two-dimensional array of packaged ICs 14, concluding the process.

Accordingly, illustrative embodiments effectively form packaged ICs 14 that have mitigated RF interference, effectively extending their frequency ranges. As such, those devices may be used for a wider variety of applications. In addition, some embodiments have a reduced footprint, permitting the overall system 10 to have a smaller footprint.

Although the above discussion discloses various exemplary embodiments of the invention, it should be apparent that those skilled in the art can make various modifications that will achieve some of the advantages of the invention without departing from the true scope of the invention.

What is claimed is:

1. A packaged IC comprising:
a package having a die paddle, a signal lead, and a ground lead; and
a die having a ground pad and a signal pad, the die being secured to the package;
the signal pad being electrically connected to the signal lead,
the ground pad being electrically connected to both the die paddle and the ground lead, wherein the die comprises a via extending from the ground pad, the via being electrically connected with the die paddle.

2. The packaged IC as defined by claim 1 wherein the die comprises a CMOS, SOI (silicon-on-insulator) CMOS, or silicon-germanium BiCMOS substrate.

3. The packaged IC as defined by claim 1 wherein the die has a top side and a back side, the top side including the ground pad and the signal pad, the back side including back side die metal in contact with the ground pad through the via, the back side die metal being electrically connected with the die paddle.

4. The packaged IC as defined by claim 1 further comprising a wirebond connecting the ground pad to the ground lead.

5. The packaged IC as defined by claim 1 further comprising a first wirebond connected between the ground pad and the ground lead, the first wirebond physically connecting the ground pad with the ground lead, the packaged IC further comprising a second wirebond connected between the ground pad and the die paddle, the second wirebond electrically connecting the ground pad with the die paddle.

6. The packaged IC as defined by claim 1 wherein the package comprises a leadframe package.

7. The packaged IC as defined by claim 1 wherein the die paddle and ground pad are configured to be at a ground potential when energized.

8. The packaged IC as defined by claim 1 wherein the die comprises a phased array configured to operate at frequencies of between about 1 Megahertz and 100 Gigahertz.

9. The packaged IC as defined by claim 1 wherein the die has a second ground pad, the package having a second ground lead, the second ground pad being electrically connected to both the die paddle and the second ground lead.

10. The packaged IC as defined by claim 9 wherein the signal lead is positioned between the ground lead and the second ground lead.

11. A packaged IC comprising:
a phased array die having a plurality of die RF groups, each die RF group comprising a first ground pad, a signal pad, and a second ground pad;
a package having a die paddle and a plurality of package RF groups, each package RF group comprising a first ground lead, a signal lead, and a second ground lead; and
a plurality of connectors connecting a given die RF group with a given package RF group, the given die RF group having given first and second ground pads and a given signal pad, the given package RF group having given first and second ground leads and a given signal lead,
the plurality of connectors comprising a first connector, a second connector, and a third connector, the first connector connecting the given first ground pad to the given first ground lead, the second connector connecting the given second ground pad to the given second ground lead, and the third connector connecting the given signal pad to the given signal lead,
the plurality of connectors also having a first paddle connector connecting the given first ground pad to the die paddle, wherein the first paddle connector comprises a via extending from the given first ground pad,
the plurality of connectors further having a second paddle connector connecting the given second ground pad to the die paddle.

12. The packaged IC as defined by claim 11 wherein the given signal lead is positioned between the first and second ground leads.

13. The packaged IC as defined by claim 11 wherein the second paddle connector comprises a via extending from the given second ground pad.

14. The packaged IC as defined by claim 11 wherein the first paddle connector comprises a first wirebond.

15. The packaged IC as defined by claim 14 wherein the second paddle connector comprises a second wirebond extending from the given second ground pad.

16. The packaged IC as defined by claim 11 wherein the package comprises a leadframe package.

17. The packaged IC as defined by claim 11 wherein the phased array die operates at frequencies of between about 1 Megahertz and 100 Gigahertz.

18. The packaged IC as defined by claim 11 wherein the die comprises a CMOS, SOI (silicon-on-insulator) CMOS, or silicon-germanium BiCMOS substrate.

19. A method of forming a packaged IC, the method comprising:
providing a die having a ground pad and a signal pad;
providing a leadframe base having a die paddle, a ground lead, and a signal lead;
electrically connecting the signal pad of the die with the signal lead of the leadframe base;
electrically connecting the ground pad of the die with the ground lead of the leadframe base;
electrically connecting the ground pad of the die with the die paddle of the leadframe base;
encapsulating the die and at least part of the leadframe base; and wherein the die comprises a via extending from the ground pad, electrically connecting the ground pad of the die with the die paddle comprising electrically connecting the via with the die paddle.

20. The method as defined by claim 19 wherein electrically connecting the ground pad of the die with the die paddle comprises securing the die to the leadframe.

21. The method as defined by claim 19 wherein electrically connecting the ground pad of the die with the die paddle of the leadframe base comprises connecting a wirebond between the ground pad of the die and the die paddle.

* * * * *